United States Patent [19]

Morris

[11] Patent Number: 5,007,369

[45] Date of Patent: Apr. 16, 1991

[54] APPARATUS FOR SOLDER COATING PRINTED CIRCUIT PANELS

[75] Inventor: Gilbert V. Morris, Amherst, N.H.

[73] Assignee: Teledyne Industries, Inc., Los Angeles, Calif.

[21] Appl. No.: 402,224

[22] Filed: Sep. 1, 1989

Related U.S. Application Data

[63] Continuation-in-part of Ser. No. 199,604, May 31, 1988, Pat. No. 4,903,631.

[51] Int. Cl.⁵ .............................................. H05K 3/22
[52] U.S. Cl. .................................... 118/56; 118/63; 118/74; 118/410; 118/424; 228/37
[58] Field of Search ................ 118/62, 63, 69, 56, 118/74, 424, 410, 602; 228/37

[56] References Cited

U.S. PATENT DOCUMENTS

| | | | |
|---|---|---|---|
| 3,053,215 | 9/1962 | Guty | 118/422 |
| 3,058,441 | 10/1962 | Walker et al. | 118/403 |
| 3,190,527 | 6/1965 | Tardoskegyi | 118/403 |
| 3,386,166 | 6/1968 | Tardoskegvi | 228/37 |
| 3,435,801 | 4/1969 | Carini et al. | 118/63 |
| 3,603,646 | 9/1971 | Leoff | 406/89 |
| 3,724,418 | 4/1973 | McLain | 228/37 |
| 3,744,557 | 7/1973 | Costello | 228/47 |
| 3,980,219 | 9/1976 | Schmid | 228/34 |
| 4,277,518 | 7/1981 | Schillke et al. | 118/69 |
| 4,361,967 | 12/1982 | Bahnsen et al. | 118/69 |
| 4,383,494 | 5/1983 | Schillke et al. | 118/69 |
| 4,465,014 | 8/1984 | Bajka et al. | 228/37 |
| 4,527,731 | 7/1985 | Kent et al. | 228/37 |
| 4,563,974 | 1/1986 | Price | 118/69 |
| 4,608,941 | 9/1986 | Morris | 118/424 |
| 4,709,846 | 12/1987 | Eldenberg | 228/34 |

FOREIGN PATENT DOCUMENTS

| | | | |
|---|---|---|---|
| 2856460 | 12/1978 | Fed. Rep. of Germany. | |
| 0032854 | 3/1978 | Japan | 228/37 |
| 62-205254 | 9/1987 | Japan | 118/424 |
| 1362695 | 12/1957 | U.S.S.R. | 406/88 |
| 0603517 | 4/1978 | U.S.S.R. | 118/74 |

*Primary Examiner*—Willard Hoag
*Attorney, Agent, or Firm*—Hayes, Soloway, Hennessey & Hage

[57] ABSTRACT

Apparatus for soldering, leveling and cooling printed circuit panels including a preheater, a fluxer, and soldering, leveling and cooling stations. The cooperation of the soldering, leveling and cooling stations provides for efficient processing of printed circuit panels. The soldering station, which includes a solder immersion chamber through which the panels are conveyed, provides an oil coating on the solder to minimize formation of dross. Automatic replenishment of oil through use of suitable flux on the panels to be soldered provide continuous cleaning of the soldering system to permit extended operation. A cooling table transports the soldered panels on a cushion of air to prevent marring.

7 Claims, 3 Drawing Sheets

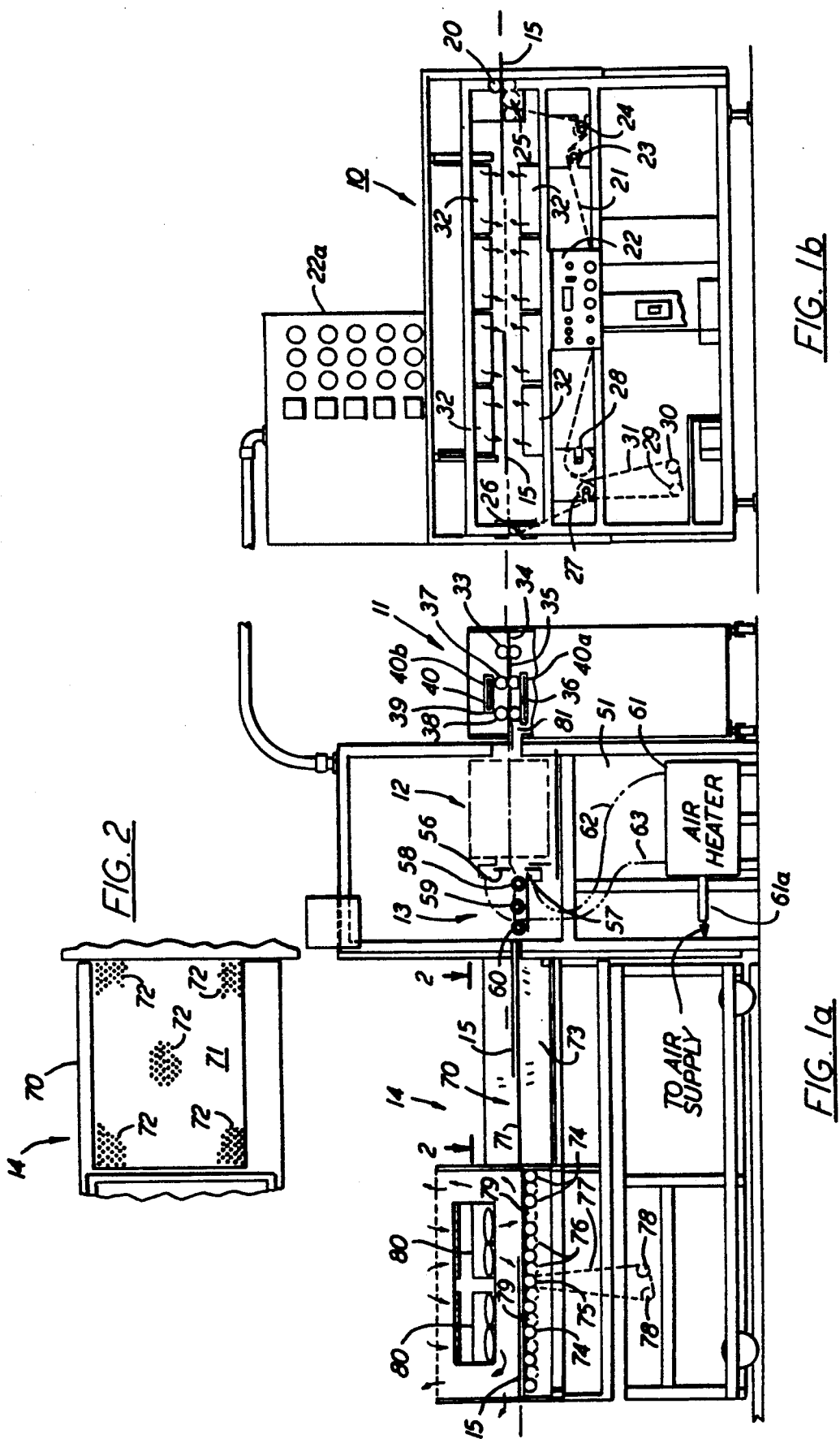

APPARATUS FOR SOLDER COATING PRINTED CIRCUIT PANELS

This is application is an continuation-in-part of application Ser. No. 199,604 filed May 31, 1988, now U.S. Pat. No. 4,903,631 issued Feb. 27, 1990.

BACKGROUND OF THE INVENTION

Printed circuits widely used in electronics and electrical devices, are formed with major dimensions of length and width and contain one or more circuits. The thickness of the printed circuit panels varies for many different reasons and directly affects panel flexibility, i.e., there are rigid and flexible circuit boards.

For example, printed circuits with multiple conductor planes use a bonded dielectric layer or layers for separation. Holes perforated through the circuit substrate serve a number of purposes including solder terminals for installation into another assembly, plated through hole interconnections between conductor planes and tooling registration holes.

Exposed copper on the finished printed circuit panels must, with few exceptions, be solder coated, a process sometimes termed presoldering or soldering. It is preferable that the solder coating be applied only where needed later and not on all conductor runs. To apply solder selectively, a dielectric, referred to as a cover dielectric or solder mask, is used to cover copper, the normally used conductor, that need not be solder coated. Thus desired copper portions remain exposed and are solder coated, including terminal pads and the like. In other words, the exposed copper on the surface or surfaces of the printed circuit must be effectively solder coated.

It is also necessary that all holes through the printed circuit be lined with solder but unobstructed by solder when finished, so as not to obstruct later component lead insertion requirements. The process of removing excess surface solder and clearing the holes of solder, after solder coating the surface conductors, is referred to as solder leveling or leveling In other words, printed circuit panels are soldered, inter alia, to maintain solderability for subsequent operations. For economic purposes, such soldering should be accomplished as a mass panel coating technique and should provide even coatings on the surfaces and in holes without surface flaws.

An apparatus for soldering printed circuit panels is disclosed in my U.S. Pat. No. 4,608,941 for "Apparatus for Soldering Printed Circuit Panels". My prior patented apparatus includes a roll configuration to convey the panels horizontally across a solder immersion station containing a flow of molten solder. Immersion of the circuit panels in flowing solder is followed by subjecting the panels to suitably positioned air knives for leveling the solder on the panels.

An improvement in the apparatus of my U.S. Pat. No. 4,608,941 is disclosed in my copending application Ser. No. 199604 filed May 31, 1988, now U.S. Pat. No. 4,903,631. According to my aforesaid application Ser. No. 199604, the solder immersion station is defined by upper and lower retainer guide means and two pairs of rolls. Each roll pair includes an upper roll and a lower roll, the rolls functioning to convey printed circuit panels horizontally through the chamber. The guide means are parallel to the rolls and the lower guide means is positioned close to the lower rolls to minimize solder leakage. The solder immersion stations also includes means adjacent the ends of the pairs of rolls for further enclosing the solder chamber. An opening is provided in the lower guide means parallel to the rolls for communication with a manifold positioned parallel to end below the solder chamber. Means are provided for pumping solder into the manifold to flood the solder chamber through the opening. Vertical manifolds close the ends of the immersion chamber and provide an additional vertical flow path to carry solder up and around panels passing through the chamber to ensure a full solder chamber. The lower guide includes lips positioned closely to the surface of the lower rolls to prevent excessive leakage of solder from the chamber before and as the rolls convey the panels through the molten solder.

SUMMARY OF THE INVENTION

The present invention provides an improvement in the apparatus of my U.S. Pat. No. 4,608,941 and copending application Ser. No. 199604 (U.S. Pat. No. 4,903,631). More particularly, the present invention provides an improved solder coating station in which the level of the molten solder in the supply and overflow collection vessels is maintained at a level below the horizontal roll nip. Since the workpiece moves in a horizontal plane, under the influence of multiple opposing upper and lower drive rolls, together with the transverse liquid solder flow channeling, excess solder overflow and dross formation is minimized.

After being solder coated, the panels are conveyed to a solder leveling station including upper and lower fluid knives to level the molten solder on the panels by removing excess solder and clearing holes through the panels, as a blast of heated air or other suitable gas or liquid. Such leveling is done close to the panel's exit from the solder immersion chamber before the solder can start to solidify. Moreover, excess solder from the panels is blown back to the output rolls and returned via a solder flow path to the sump of the soldering system.

From the leveling station, the panels are transported to a cooling station comprising an air transport table provided with a perforated surface through which cooling air flows to support the panels on a cushion of air. The panels are then conveyed under a further flow of air to cool their upper surfaces, all in accordance with the teachings of my aforesaid copending application Ser. No. 199604, now U.S. Pat. No. 4,903,631.

Using the inventive system, a wide variety of printed circuit panels, both flexible and rigid, and of various sizes and thicknesses, can be soldered on both sides rapidly without subjecting the substrate of the panels to elevated solder temperatures for more than a brief interval. The system can be operated over extended periods without the need for shut downs to attend to cleaning. Moreover, the cooling air table functions to solidify the solder without tracking and marring the soldered conductor surfaces.

DESCRIPTION OF THE DRAWINGS

The invention will be further described in connection with the accompanying drawings in which like numerals indicate like parts, and wherein:

FIGS. 1a and 1b combine to provide a front view, partially broken away, showing diagrammatically the entire soldering system of the present invention.

FIG. 2 is a plan view, partially broken away, of the cooling air table shown in FIG. 1a.

DESCRIPTION OF EXEMPLARY EMBODIMENT

Figure 3A:
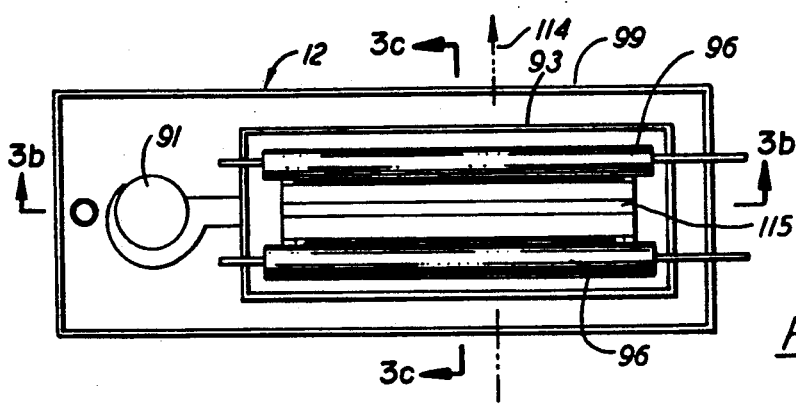
FIGS. 3a, 3b and 3c present detail views of the improved printed circuit solder panel solder coating station of the present invention.

Referring to the invention in greater detail with reference to FIGS. 1A and 1B which together show the soldering system, a preheater 10, a fluxer 11, an improved solder station 12, a solder leveling station 13 and a cooling station 14 are arranged to receive and process printed circuit panels 15.

The preheater 10 includes input rolls 20 which, when the panels 15 are fed thereto, transport them to a suitable open conveyer belt 21, for example a stainless steel wire belt to enable exposure of the lower panel surfaces, as well as their upper surfaces, to infrared radiation. The conveyor is driven along a path including guide rolls 23, 24, 25, 26 and 28. Suitably driven rolls 29 and 30 are connected by one or more belts 31 to a drive pulley 27. Idler rolls 20a at each end of the roll 25 drive the input rolls 20. Modules 22 and 22a include various control switches and indicators for the system.

Diagrammatically shown infrared heating elements 32 are located above and below the conveyor 21 to preheat panels 15 as they pass through the preheater 10. In an exemplary embodiment of the system, the panels 15 are conveyed through the preheater 10 at speeds on the order of 6 inches per second, and exit from the preheat roll 26 at a surface temperature on the order of 250 degrees to 300 degrees F., as discussed in greater detail hereinafter.

The panels 15 enter the fluxer 11 at entry rolls 33 for conveying the heated printed circuits along plates 34, 35 and 36 through pairs of fluxing rolls 37 and 38 having soft fibrous and absorbent surfaces. As diagrammatically shown, a suitable soldering flux 39, described hereinafter, is supplied in appropriate quantities to rolls 37 and 38 to coat the panels 15 as they pass through the fluxer. For example, an appropriate pump provided in the fluxer, which holds a quantity of flux in a container, pumps the flux through suitable piping to a distribution manifold 40 diagrammatically shown above the rolls 37 and 38 for spilling the flux onto the rolls 37 and 38 for transfer to the heated panels 15. A container 40a below the rolls 37 and 38 is filled with flux via an outlet 40b, located at one end of the rolls, from the manifold 40. The container 40a also receives flux from the manifold 40 flow to the rolls. Thus the coating rolls 37 and 38 receive the flux from both the manifold 40 and the container 40a.

The soldering station 12, shown in FIG. 1A, and in more detail in FIGS. 3–9, includes suitably driven rolls 41 to receive the panels 15 from the fluxer 11 and convey them to pairs of rolls 42 and 43.

The panels are then conveyed to the solder leveling station 13 which includes upper and lower air knives 56 and 57 tapered rolls 58, 59 and 60 suitably coupled to drive means, as diagrammatically shown in FIG. 2. Air heater 61 is supplied from an external air supply hose 61a to furnish compressed air through diagrammatically shown air lines 62 and 63 to the upper and lower air knives 56 and 57, respectively. Holes through the panel are effectively cleared of solder by the air knives, and excess solder is stripped from the surface and the solder leveled on the conductive portions of the printed circuit panels 15. Solder removed from the panels 15 returns to the solder sump through the solder skim section and return flow, an important feature of the invention as discussed hereinafter.

Solder leveler conveying rolls 58, 59 and 60 are double tapered from their outer edges to a smaller diameter at their center lines, so that the panels 15, which have just been soldered and leveled, are engaged at their edges by the tapered rolls, hence the still liquid solder is not disturbed and tracked.

The panels 15 are conveyed by the tapered rolls to the cooler 14 which includes an air table 70 slightly tilted so that its input is above its output. For example, with a 36 inch long table, the input end can be 0.5 inches higher than the output to convey the panels at a desired speed. As shown in FIGS. 1A and 2, perforations 72 provided over the entire surface 71 of the table 70, supply cooled air to the panels 15 from a suitable air pump (not shown) supplying pressurized air to an air manifold 73 under the perforated surface 71. The panels 15 delivered to the cooler 14 float on an air cushion above the table and are cooled as they are conveyed across the table. The integrity of the molten solder on the panel conductors is not impaired by contact with any conveying device until the solder has been solidified.

As the panels 15 float from the air table 70, they are conveyed by suitably tapered rolls 74, similar in configuration to the rolls 58–60. The rolls 74 are driven at their ends by a drive gear 75, which engages driven gears 76 between the tapered conveyer rolls 74. Suitable belts 77 driven by pulleys or gears 78 rotate the drive gear 75 at a desired speed. Guide plates 79 are also provided between the rolls 74 to facilitate conveyance of the soldered panels 15. Diagrammatically shown cooling fans 80 flow air downwardly onto the upper surface of the panels 15 to cool the upper soldered surfaces. The cooled and soldered panels 15 are then conveyed out the cooler 14 as finished soldered printed circuits.

Details of the improved circuit panel solder coating station are shown in FIGS. 3 through 9. Refer to FIG. 3, top view 3a, front elevation view 3b and side elevation and section view in 3c, for the improved solder coating station 12. The direction of travel for the circuit panel is indicated in FIG. 3a by arrow 114. A set of four feed rolls 96 guide and transport the circuit panels through the solder coating station 12. A solder conduit formed and defined by upper flow plates 98, lower flow plates 101 separated by two flow plate spacer blocks 109 (not shown in this Figure) and the two end drain blocks 113 is fixed in the longitudinal space between the pairs of entrance and exit transport rolls 96.

Figure 3B:
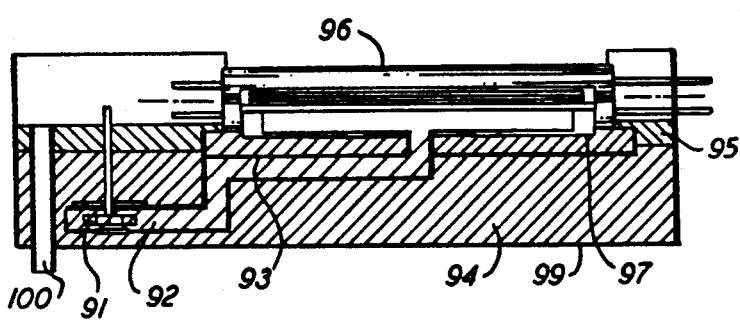

The solder conduit is suspended above the secondary solder vessel 93, which in turn is affixed above the primary solder vessel 99. A solder feed pump 91 circulates molten solder out of the primary solder vessel 99 up through the solder feed duct 92 and into the distribution vessel (manifold) 97, as illustrated in FIG. 3b. The secondary solder vessel 93 collects the overflow of excess molten sOlder and other residuals, such as oil and dross from the circuit panel solder plating area, defined as the solder conduit 115. The secondary solder vessel 93, in turn, returns the overflow to the primary solder vessel 99 located beneath it. The molten solder 94 in the primary solder vessel 99 is automatically maintained at the proper temperature by a suitable arrangement of heaters, temperature sensors and switching controls. Molten solder, oil, contaminants and other residuals 95 will float to the top of the solder 94 in the primary solder vessel 99.

Figure 3C:
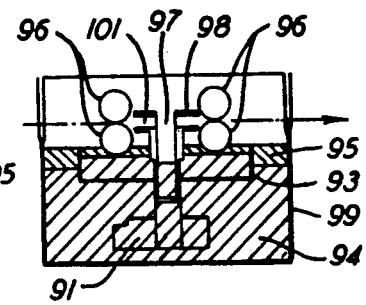
Figure 4A:
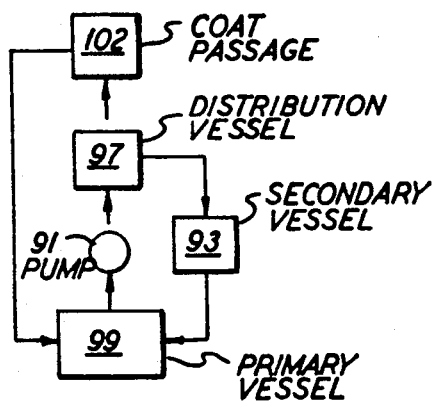
FIGS. 4a and 4b show a functional block diagram and an exploded view of the the molten solder flow paths for the improved printed circuit panel solder coating station.
Figure 4B:
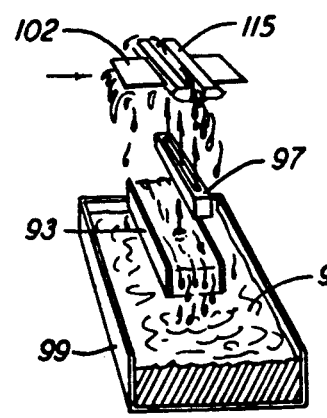
Figure 5:
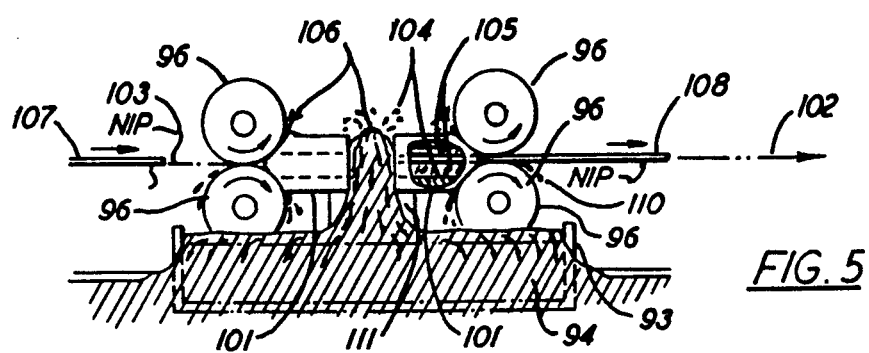
FIG. 5 is a horizontal transverse view of the improved printed circuit panel solder coating system, illustrating the movement of workpieces in the presence of molten solder in the solder coating station.

The improved design of a solder coating station 12 causes the molten solder 94, during the coating operation and afterwards, to flow across the path 114 of the circuit panel direction when moving through the rolls 96. This results in improved solder coating control. In addition, the design of solder coating station 12 minimizes the amount of liquid solder 94 that will escape roll contact "nip" between adjacent roll 96. Further, the design permits a high volume non-turbulent solder flow rate, while permitting the level of the molten solder 94 in the solder coating conduit 115 to be maintained at a level below the horizontal plane 102 that a circuit panel moves along, during the solder coating operation. As illustrated in FIGS. 3c, 4b and 5, the molten solder 94 distribution vessel (manifold) 97 brings the solder up from the pump 91 and into the solder conduit 115 resulting in a smooth, non-turbulent standing wave.

FIG. 4b comprises an isometric pictorial representation of the solder station 12. FIG. 4a comprises a functional block diagram illustrating the flow of molten solder 94 from and into the appropriate sections of the solder station 12. The nip plane 102 for the circuit panel moves through the center of the solder conduit 115, said conduit being filled with molten solder 94. Excess molten solder flows through the solder conduit in a direction transverse to the direction of circuit panel transport through the solder plating station 12. The excess solder is collected at either end of the transverse flow channel by two drain blocks 113, located at the front and back of the solder station. For purposes of illustration of the actual flow path of the molten solder 94, the distribution vessel 97 feeds the molten solder 94 from the solder pump 91 up and into the conduit 115. The excess solder, returning at the sides of the conduit 115 through the drain blocks 113, is collected in the secondary solder vessel 93. This, in turn, feeds the balance of the molten solder into the primary solder vessel 99.

FIG. 5 shows the improved solder station in elevation view and partial section. Looking perpendicular to the edge of the horizontal circuit panel edge path, or nip plane 102, on the left or workpiece input side of the illustration a preheated circuit panel 107 that has been properly cleaned, fluxed and appropriately preheated in known manner is about to enter between the drive and positioning roll pair 96. Likewise, on the righthand side of the drawing, a circuit panel 108 that has just completed being solder coated is exiting via the righthand drive and positioning rolls 96. Both boards 107 and 108 are transversing through the improved solder station 12 along the nip plane 102.

The secondary solder vessel 93 collects the excess molten solder 111, for mixing with the main body of molten solder 94 in the primary solder vessel 99. The solder conduit 115, through which the circuit panels pass to be solder coated, has its volume defined on the left by the "nip" of the two rolls 96. Likewise, the two rolls 96 on the right define the right extreme of the conduit volume where they also form a "nip" along the line of circular contact. The solder conduit is further defined by the upper flow plates 98 and the lower flow plates 101, in addition to the flow plate spacer blocks 109 and the drain blocks 113.

Flux droplets 104, dispersed by molten solder, collect to form oil slicks 106, such mixture aiding in the lubrication of the conveyor rolls 96, and to prevent the formation of dross. It should be noted that the solder pump preferably will be shut off between runs of panels. Also contained in the molten solder in the solder conduit, as well as the excess solder leaving the solder conduit 115, are some flux outgassing sites entrained in the solder. Volatiles are added to the flux to improve dispersal rate of these outgassing products 105. Any excess solder, flux or other materials 110 that bypass the roll and circuit panel "nip" 103 are returned to the secondary solder vessel 93.

Figure 6:
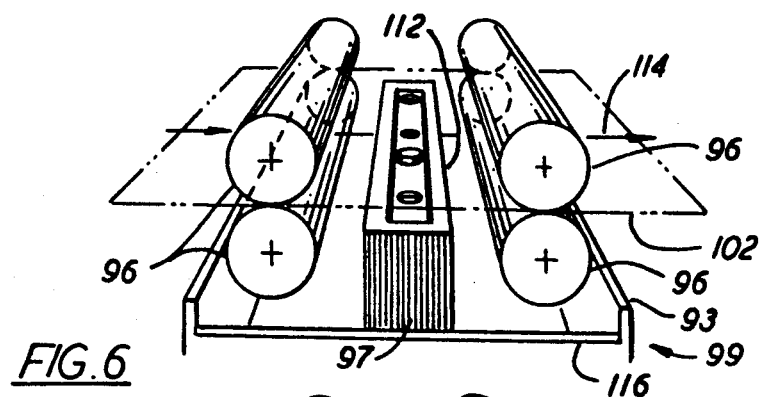
FIG. 6 is a partial assembly view showing the location of the distribution vessel (manifold) within the solder coating station.

FIG. 6 shows additional details of the construction of the improved solder station 12. One of the key elements to the improved performance of the solder station 12 is the distribution vessel or manifold 97, located midway between the two pairs of conveyor rolls 96, at an angle perpendicular to the line of travel 114 of the circuit panels in the nip plane 102. The secondary vessel 93 is slightly larger than the surface area of the combined conveyor roll 96 and distribution vessel. This enables excess solder to be collected in the secondary vessel 93, which in turn overflows the secondary vessel along edge 116 and returns to the primary vessel 99. The function of the secondary vessel overflow along edge 116 is to maintain an appropriate depth of molten solder therein. Located in the distribution vessel or manifold 97 is a solder feed pipe 112, through which molten solder from the solder pump 91 moves solder up to the solder conduit 115. This is the region where the uncoated circuit panels 107 pass and emerge with a solder coating 108.

Figure 7:
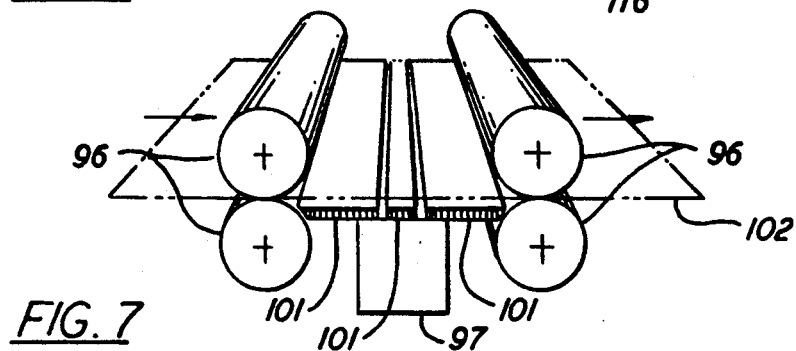
FIG. 7 illustrates the placement of the lower flow plates on top of the manifold.

Following in succession, FIG. 7 illustrates details of the lower end of the solder conduit 115, which is stacked vertically above the distribution vessel 97 to create the solder conduit volume 115, that being the lower flow plates 101. Flow plates span the distance between lower transport rolls 96 and thus form the bottom of the solder conduit 115.

Figure 8:
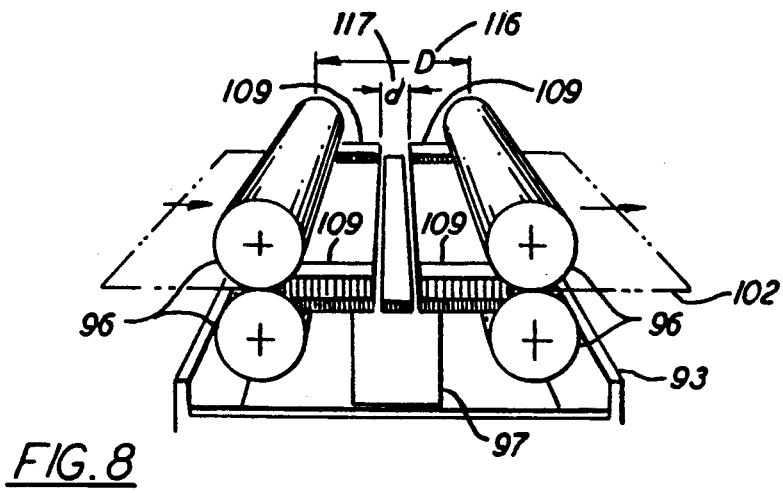
FIG. 8 illustrates the addition and location of spacer blocks at both ends of the lower flow plates.

FIG. 8 illustrates details of the flow plate spacer blocks 109, that are installed above the lower flow plates 101, to define a transverse dimension to the solder conduit 115. A solder overflow space 117, between the spacer blocks 109, is provided to allow excess solder to exit in a direction transverse to the passage of circuit panels in the nip plane 102. This has important consequences in facilitating the improved performance of the invention, that improve the speed and quality of the solder coating operation. It also serves to reduce to leakage of excess solder through the roll nips and permitting the circuit panel plating operation to function with a level of molten solder maintained below the nip plane 102. Note that the center distance 118 between the rolls 96 is set in conjunction with the dimensions of the solder conduit assembly 115, so that the rolls 96 are properly spaced adjacent to the solder conduit structure.

Figure 9:
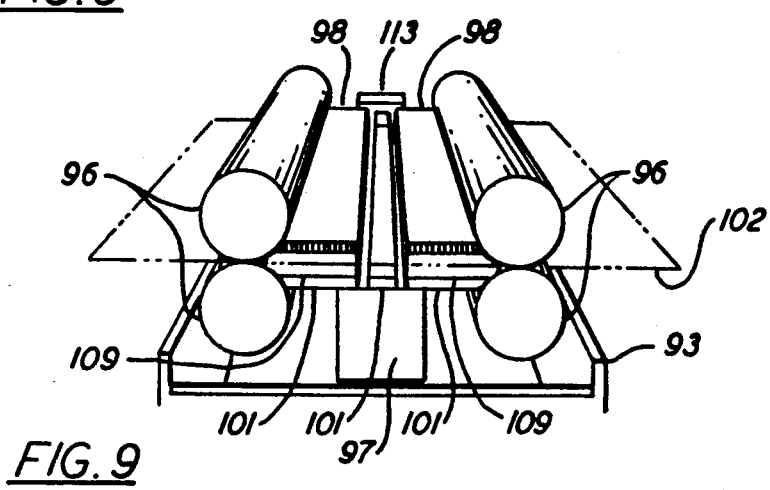
FIG. 9 illustrates the placement of the upper flow plates, on top of the spacer blocks.

FIG. 9 illustrates details of upper and final pieces that are installed to form the solder conduit 115, that being the upper flow plates 98 and the drain blocks 113 that are installed on both ends of the solder conduit overflow slot 117.

While the invention has been describe in connections with a specific embodiment, it will be understood that modifications may be made by those skilled in the art and that the invention is defined by the appended claims.

I claim:

1. In apparatus for soldering printed circuit panels comprising a plurality of stations through which the printed circuit panels are conveyed in line, through a horizontal path, the stations including a preheat station having heating means and means for conveying the panels through the preheat station to elevate the temperature of the panels, a flux station for coating the panels with a flux and including means for conveying the panels through the flux station, a soldering station including at least one solder immersion chamber through which said printed circuit panels may be horizontally conveyed for coating the panels with molten solder, the improvement wherein the solder station comprises a solder manifold below the travel path of the panels through the soldering station, and means for pumping molten solder into the manifold whereby to form a standing wave of molten solder, the crest of which extends above the travel path of the panels, said standing wave of molten solder having sufficient volume flow so as to flood at least in part the top side of the panels as they are conveyed through the standing solder wave, said soldering station also comprising a solder immersion chamber defined by upper and lower retainer guide means and two pairs of rolls, the rolls functioning to convey printed circuit panels horizontally through the chamber, each roll pair including an upper roll and a lower roll, the guide means being parallel to the rolls and the lower guide means positioned close to the lower rolls to minimize solder leakage, an opening in the lower guide means parallel to the rolls, the manifold parallel to and below the solder chamber communicating with the opening in the lower guide means, the manifold including side plates terminating below the travel path of said panels for draining excess solder from said manifold.

2. In apparatus as defined in claim 1, the improvement wherein said manifold is located midway between said two pairs of rolls.

3. In apparatus as defined in claim 1, and further including a solder leveling station adjacent the exit of the solder immersion chamber including upper and lower fluid knives to level the molten solder and open holes in the panels by removing excess solder.

4. In apparatus as defined in claim 1, and further including a cooling station for cooling the soldered panels following leveling.

5. In apparatus as defined in claim 4, where the cooling system comprises an air transport table including a perforated surface, and means for flowing cooling air through the perforations to convey and support the panel on a cushion of air thereby cooling the panel.

6. Apparatus as defined in claim 1, wherein the preheat station comprises an infrared heater providing radiation at a predominant wavelength on the order of 3.5 microns to the panels.

7. Apparatus as defined in claim 3, wherein the solder leveling station comprises upper and lower air knives for blowing the excess solder on the panels into the soldering station where it may be recycled the solder for subsequent use in the soldering system.

* * * * *